(12) United States Patent
Liang et al.

(10) Patent No.: US 10,636,949 B2
(45) Date of Patent: Apr. 28, 2020

(54) LED PACKAGE AND METHOD FOR MANUFACTURING THE SAME

(71) Applicant: HUAZHONG UNIVERSITY OF SCIENCE AND TECHNOLOGY EZHOU INDUSTRIAL TECHNOLOGY RESEARCH INSTITUTE, Ezhou (CN)

(72) Inventors: Renli Liang, Wuhan (CN); Linlin Xu, Wuhan (CN); Hao Wang, Wuhan (CN); Jingwen Chen, Wuhan (CN)

(73) Assignee: HUAZHONG U. OF SCI. AND TECH. EZHOU INDUSTRIAL TECHNOLOGY RESEARCH INSTITUTE, Ezhou (CN)

( * ) Notice: Subject to any disclaimer, the term of this patent is extended or adjusted under 35 U.S.C. 154(b) by 0 days.

(21) Appl. No.: 16/145,222

(22) Filed: Sep. 28, 2018

(65) Prior Publication Data
US 2019/0035991 A1    Jan. 31, 2019

Related U.S. Application Data

(63) Continuation of application No. PCT/CN2017/112235, filed on Nov. 22, 2017.

(30) Foreign Application Priority Data

Jun. 29, 2017  (CN) .......................... 2017 1 0514855

(51) Int. Cl.
*H01L 33/56* (2010.01)
*H01L 33/58* (2010.01)

(52) U.S. Cl.
CPC .............. *H01L 33/56* (2013.01); *H01L 33/58* (2013.01); *H01L 2933/005* (2013.01); *H01L 2933/0058* (2013.01)

(58) Field of Classification Search
CPC ....... H01L 31/02023; H01L 31/02162–02165; H01L 51/448; H01L 33/52; H01L 33/56; H01L 33/58; G02B 5/00
See application file for complete search history.

(56) References Cited

U.S. PATENT DOCUMENTS

2017/0154943 A1\* 6/2017 Yang .................... G09G 3/3208

\* cited by examiner

*Primary Examiner* — Tucker J Wright
(74) *Attorney, Agent, or Firm* — Hemisphere Law, PLLC; Zhigang Ma

(57) ABSTRACT

A LED package includes a substrate, a LED chip, a sealing layer; and a quartz glass in this order. The sealing layer includes a graphene oxide fluororesin sealant layer and a KH550 silane coupling agent layer. The graphene oxide fluororesin sealant layer is composed of a graphene oxide dispersion liquid and a fluororesin matrix. The KH550 silane coupling agent layer is composed of deionized water solution and silane coupling agent. The disclosure further provides a method of manufacturing LED package.

7 Claims, 6 Drawing Sheets

LED PACKAGE AND METHOD FOR MANUFACTURING THE SAME

FIELD

The subject matter herein generally relates to a light emitting diode (LED) package and method of manufacturing the LED package.

BACKGROUND

Deep ultraviolet LEDs are generally made of AlGaN material. The deep ultraviolet LED is used in the fields of sterilization, confidential communication, biochemical detection and special lighting. Hermosetting epoxy resins and organosiloxane resins are widely used as sealant materials for LED devices. These resins are spotted directly on a chip and cured to form a solid sealant. However, organic mediums in the resins easily absorbultraviolet rays, which tends to a poor transmittance and easy photolysis failure. Thus, the resin is unsuitable for using in deep ultraviolet LED package.

Therefore, fluoropolymers based on C—F have attracted widespread attention. S-type polymerized perfluoro-4-vinyloxy-1-butene with a stable end (—CF3) are manufactured. The S-type fluoropolymer has excellent ultraviolet transmittance and strong ultraviolet stability, which plays an important role in improving the performance of the deep ultraviolet LED.

However, the fluoropolymer has a poor adhesion. Thus, the fluoropolymer is difficult to be employed in the deep ultraviolet LED sandwich structures (chip-sealant-quartz lenses), and air barrier affects an optical output power and heat transfer of the deep ultraviolet LED, which causes oxygen and water vapor in the external environment to erode the chip and causes the deep ultraviolet LED to fail.

Therefore, there is room for improvement within the art.

BRIEF DESCRIPTION OF THE DRAWINGS

Implementations of the present technology will now be described, by way of example only, with reference to the attached figures.

DETAILED DESCRIPTION

Figure 1:
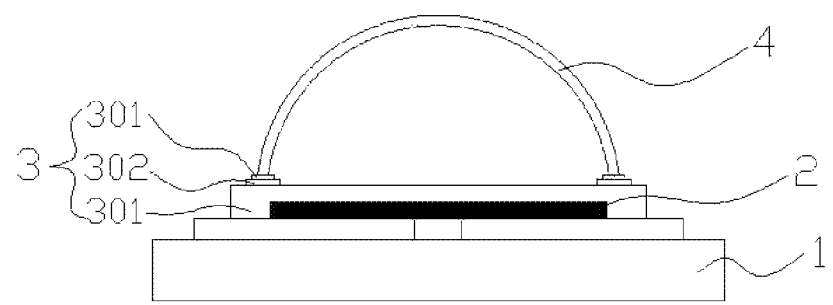
FIG. 1 is a diagram of an exemplary embodiment of a LED package.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

Referring to FIG. 1, a LED package 100 is presented in accordance with a first exemplary embodiment. The LED package 100 includes a substrate 1, a chip 2, a sealing layer 3, and a quartz glass 4 in this order. The sealing layer 3 includes a 0.05 wt % concentration of graphene oxide fluororesin sealant layer 302 and a 1 wt % KH550 silane coupling agent layer 301. The 0.05 wt % concentration of graphene oxide fluororesin sealant layer 302 is composed of 2 mg/mL graphene oxide dispersion liquid and fluororesin matrix. The 2 mg/mL graphene oxide dispersion liquid is composed of graphene oxide powder and anhydrous ethanol. The 1 wt % KH550 silane coupling agent layer 301 is composed of 5 wt % deionized water solution and KH550 silane coupling agent. The 5 wt % deionized water solution is composed of deionized water and absolute ethanol.

In at least one embodiment, the fluororesin matrix is a polymerized perfluoro-4-vinyloxy-1-butene having a —CF3 terminal, which is polymerized from inorganic molecules of fluorine element. Thus, the fluororesin matrix has a high ultraviolet transmittance, an excellent ultraviolet radiation stability, a good water and oxygen resistance and a poor adhesion.

In at least one embodiment, the graphene oxide powder is manufactured by a hummers method. The graphene oxide powder has a typical quasi-two-dimensional structure, which has sheet layers contain many oxygen-containing groups. The graphene oxide powder has a high specific surface energy, a good hydrophilicity, a high thermal conductivity, a mechanical properties and a barrier effect. Thus, the graphene oxide powder is an ideal composite doping material.

In at least one embodiment, the KH550 silane coupling agent contains two different reactive groups, an amino group and an oxy group, for coupling an organic polymer and an inorganic filler.

Figure 2:
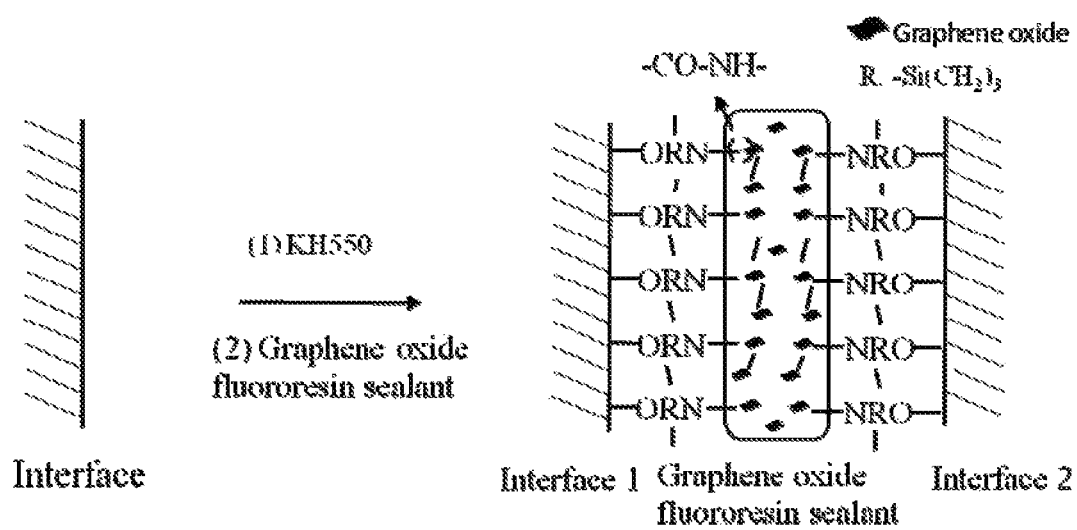
FIG. 2 is a diagram of a principle of a reaction between the graphene oxide powder and the KH550 silane coupling agent.

FIG. 2 shows a principle of a reaction between the graphene oxide powder and the KH550 silane coupling agent. The graphene oxide powder reacts with the KH550 silane coupling agent to form molecular crosslinks, and a bonding interface and the fluororesin matrix are tightly held together like numerous molecular anchors, which improves a bonding ability of the fluororesin sealant and ensures the reliability of the LED package.

Figure 3:
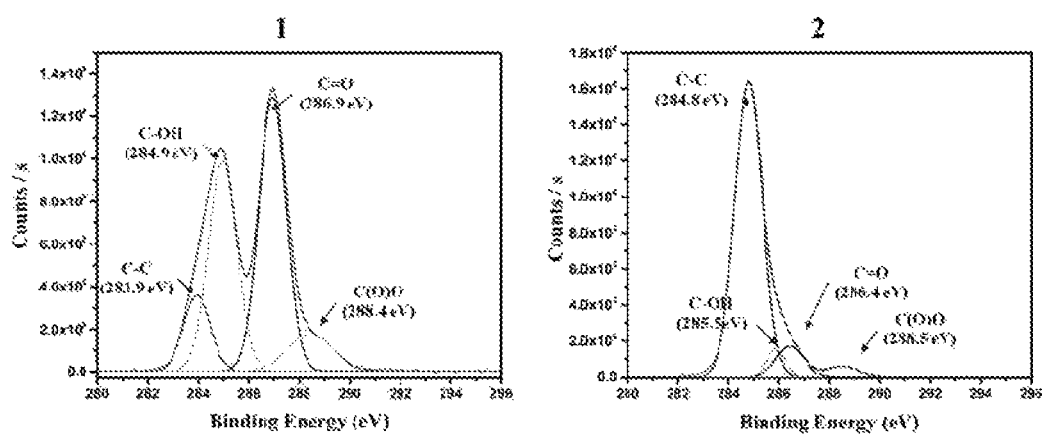
FIG. 3 is a schematic diagram of a comparison of C1s photoelectron spectra of the graphene oxide powder and the graphene oxide powder reacting with the KH550 silane coupling agent, 1 is C1s photoelectron spectra of the graphene oxide powder, and 2 is C1s photoelectron spectra of the graphene oxide powder reacting with the KH550 silane coupling agent.

FIG. 3 is a schematic diagram of a comparison of C1s photoelectron spectra. To prove the designed anchored crosslinks between the fluoropolymer embedded by the graphene oxide powder (GO) and the KH550 silian coupling agent (APTS), the X-ray photoelectron spectroscopy (XPS) of the graphene oxide powder reacting with the KH550 silane coupling agent (m-GO) were respectively investigated, and the results are shown in FIG. 3. Compared with the GO (1 of FIG. 3), the peak intensity of C—OH (285.9 eV), C=O (286.7 eV) and C—C=O (288.5 eV) in m-GO48-49 are obviously decreased in m-GO because of the reaction between GO and APTS. The N1s, Si2s, and Si2p peaks of m-GO are observed (2 of FIG. 3), confirming the existence of the molecule APTS as the anchor chain.

Figure 4:
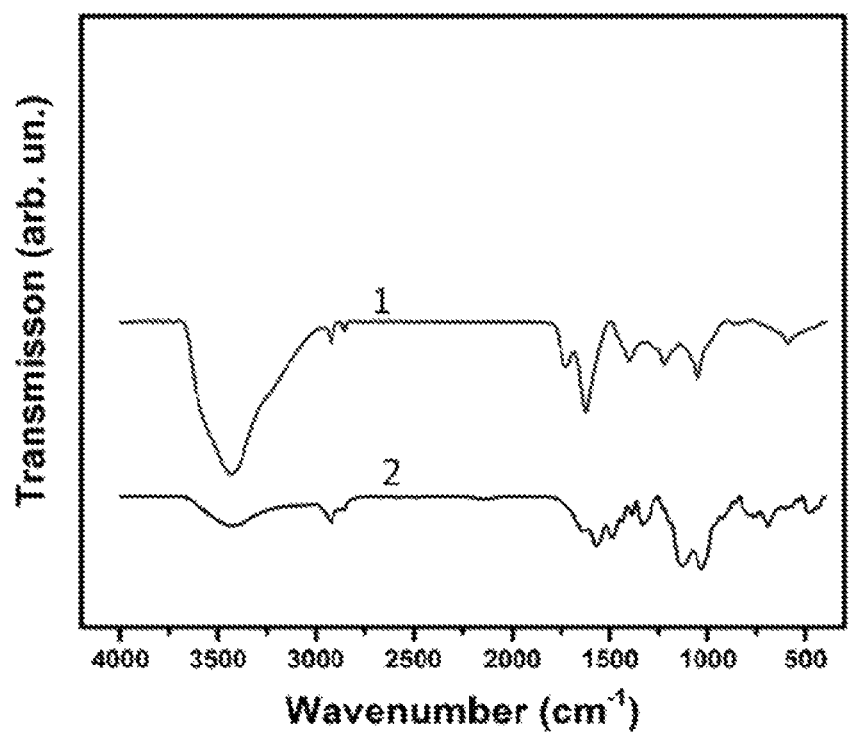
FIG. 4 is a schematic diagram of a comparison of infrared spectra of the graphene oxide powder and the graphene oxide powder reacting with the KH550 silane coupling agent.

FIG. 4 is a schematic diagram of a comparison of infrared spectra, 1 is the infrared spectra of the graphene oxide powder, and 2 is the infrared spectra of the graphene oxide powder reacting with the KH550 silane coupling agent. FIG. 4 shows the FTIR spectra results of GO (1) and m-GO (2), and they indicate the existence of —O—H (3433 cm$^{-1}$), —C=O (1725 cm$^{-1}$), —O—H (1624 cm$^{-1}$), —C—O (1403 cm$^{-1}$), and —C—O—C (1053 cm$^{-1}$)$^{50\text{-}53}$, illustrating that there are a large number of oxygen-containing groups grown on the surface of GO. Compared the FTIR spectra result of GO with that of m-GO, the peak of —O—H (3433 cm$^{-1}$) becomes wide and weak, and the peak of —C—OH also disappears, suggesting a chemical crosslink formed between the APTS and GO according to following reaction:

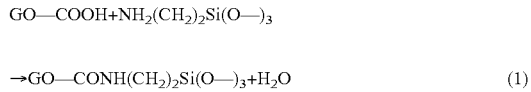

→GO—CONH(CH$_2$)$_2$Si(O—)$_3$+H$_2$O   (1)

FIG. 3 and FIG. 4 actually prove that the graphene oxide powder and the KH550 silane coupling agent can react chemically. FIGS. 3 and 4 provide a factual basis for the theory of FIG. 2.

In at least one embodiment, the KH550 silane coupling agent layer 301 is distributed on both sides of the graphene oxide fluororesin sealant layer 302. The KH550 silane coupling agent layer 301 is disposed on contact surfaces of the LED chip 2 and the quartz glass 4. The above structure has a better bonding effect.

Figure 5:
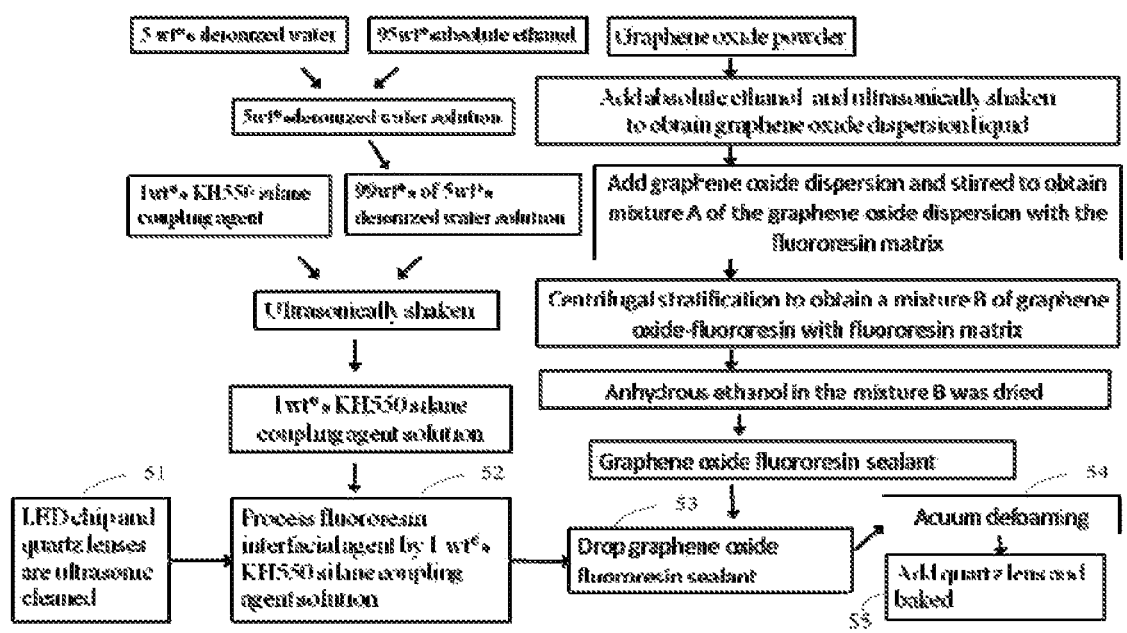
FIG. 5 is a diagram of a method for manufacturing a LED package.

Referring to FIG. 5, a method for manufacturing the LED package 100 in first exemplary embodiment is presented. The method for manufacturing the LED package 100 is provided by way of example, as there are a variety of ways to carry out the method. The exemplary method can begin at step 51.

At step 51, a LED chip without quartz lenses and quartz lenses are ultrasonic cleaned.

At step 52, the 1 wt % KH550 silane coupling agent solution in the fluororesin interfacial agent of the LED package was dropped on the surface of the LED chip and the bottom of the quartz lens, and after evenly applied, the LED chip and the quartz lens are baked at 80° C. for 5 minutes to obtain the KH550 silane coupling agent layer.

At step 53, the 0.05 wt % concentration of graphene oxide fluororesin sealant in the fluororesin interfacial agent is coated on the surface of the LED chip by a dispenser to obtain the graphene oxide fluororesin sealant layer.

At step 54, the LED chip coated by the 0.05 wt % concentration of graphene oxide fluororesin sealant in the fluororesin interfacial agent (the graphene oxide fluororesin sealant layer in step 53) is processed by vacuum defoaming for 10 minutes to form the sealing layer, and the KH550 silane coupling agent layer of the quartz lens is added on the sealing layer and adjusted to the center of the LED chip to form the LED package 100 in the first exemplary embodiment.

At step 55, the LED package is baked in an oven, a baking temperature was set to 80° C., and a reaction time was 12 hours, and then the LED package 100 shown in FIG. 1 was obtained.

In at least one embodiment, steps of manufacturing the 1 wt % KH550 silane coupling agent solution in the step 52 is as follows: first, deionized water is added to absolute ethanol, and ultrasonically oscillated to obtain 5 wt % deionized water solution, then the KH550 silane coupling agent are added to the 5 wt % deionized water, and ultrasonically shaking the 5 wt % deionized water solution with the KH550 silane coupling agent to obtain the 1 wt % KH550 silane coupling agent solution.

In at least one embodiment, steps of manufacturing the 0.05 wt % concentration of the graphene oxide fluororesin sealant in step 53 is as follows: first, the graphene oxide powder is ball-milled by a ball mill, and a certain weight of the graphene oxide powder is added to absolute ethanol, after 1 hour of ultrasonic vibration, to obtain 2 mg/mL of graphene oxide dispersion; then the 2 mg/mL graphene oxide dispersion was added to a centrifuge tube containing the fluororesin matrix, and stirred with a glass rod for 15 minutes to obtain a mixture A of the graphene oxide dispersion with the fluororesin matrix, and then the mixture A is placed in a centrifuge, and the number of revolutions is set to 10,000 rpm, to carry out centrifugal stratification to obtain a mixture B of the graphene oxide-fluororesin with the fluororesin matrix. Then anhydrous ethanol in the mixture B was naturally dried, and the remaining liquid was further stirred for 1 hour to obtain the 0.05 wt % concentration of the graphene oxide fluororesin sealant.

Also referring to FIG. 1, in a second exemplary embodiment, the LED package 100 includes a substrate 1, a chip 2, a sealing layer 3, and a quartz glass 4 in this order. The sealing layer 3 includes a 0.1 wt % concentration of a graphene oxide fluororesin sealant layer 302 and a 1 wt % KH550 silane coupling agent layer 301. The 0.1 wt % concentration of the graphene oxide fluororesin sealant layer 302 is composed of a 2 mg/mL graphene oxide dispersion liquid and a fluororesin matrix. The 2 mg/mL graphene oxide dispersion liquid is composed of graphene oxide powder and anhydrous Ethanol composition. The 1 wt % KH550 silane coupling agent layer 301 consists of a 5 wt % deionized water solution and a KH550 silane coupling agent. The 5 wt % deionized water solution solution is composed of deionized water and absolute ethanol.

In at least one embodiment, the fluororesin matrix is a polymerized perfluoro-4-vinyloxy-1-butene having a —CF3 terminal, which is polymerized from inorganic molecules of a fluorine element. Thus, the fluororesin matrix has a high ultraviolet transmittance, an excellent ultraviolet radiation stability, a good water and oxygen resistance and a poor adhesion.

In at least one embodiment, the graphene oxide powder is prepared by a Hummers method. The graphene oxide powder has a typical quasi-two-dimensional structure, which has sheet layers contain many oxygen-containing groups. The graphene oxide powder has a high specific surface energy, a good hydrophilicity, a high thermal conductivity, a mechanical properties and a barrier effect. Thus, the graphene oxide powder is an ideal composite doping material.

In at least one embodiment, the KH550 silane coupling agent contains two different reactive groups, an amino group and an oxy group, for coupling an organic polymer and an inorganic filler.

FIG. 2 shows a principle of a reaction between the graphene oxide powder and the KH550 silane coupling agent. The graphene oxide powder reacts with the KH550 silane coupling agent to form molecular crosslinks, and a bonding interface and the fluororesin matrix are tightly held together like numerous molecular anchors, which improves a bonding ability of the fluororesin sealant and ensures the reliability of the LED package.

FIG. 3 is a schematic diagram of a comparison of C1s photoelectron spectra. To prove the designed anchored crosslinks between the fluoropolymer embedded by the graphene oxide powder (GO) and the KH550 silian coupling agent (APTS), the X-ray photoelectron spectroscopy (XPS) of the graphene oxide powder reacting with the KH550 silane coupling agent (m-GO) were respectively investigated, and the results are shown in FIG. 3. Compared with the GO (1 of FIG. 3), the peak intensity of C—OH (285.9 eV), C=O (286.7 eV) and C—C=O (288.5 eV) in m-GO48-49 are obviously decreased in m-GO because of the reaction between GO and APTS. The N1s, Si2s, and Si2p peaks of m-GO are observed (2 of FIG. 3), confirming the existence of the molecule APTS as the anchor chain.

FIG. 4 is a schematic diagram of a comparison of infrared spectra, 1 is the infrared spectra of the graphene oxide powder, and 2 is the infrared spectra of the graphene oxide powder reacting with the KH550 silane coupling agent. FIG. 4 shows the FTIR spectra results of GO (1) and m-GO (2), and they indicate the existence of —O—H (3433 cm$^{-1}$), —C=O (1725 cm$^{-1}$), —O—H (1624 cm$^{-1}$), —C—O (1403 cm$^{-1}$), and —C—O—C (1053 cm$^{-1}$)$^{50\text{-}53}$, illustrating that there are a large number of oxygen-containing groups grown on the surface of GO. Compared the FTIR spectra result of GO with that of m-GO, the peak of —O—H (3433 cm$^{-1}$) becomes wide and weak, and the peak of —C—OH also disappears, suggesting a chemical crosslink formed between the APTS and GO according to following reaction:

GO—COOH+NH$_2$(CH$_2$)$_2$Si(O—)$_3$

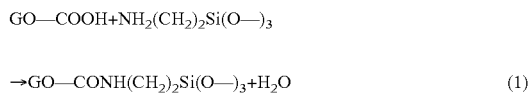

→GO—CONH(CH$_2$)$_2$Si(O—)$_3$+H$_2$O    (1)

FIG. 3 and FIG. 4 actually prove that the graphene oxide powder and the KH550 silane coupling agent can react chemically. FIGS. 3 and 4 provide a factual basis for the theory of FIG. 2.

In at least one embodiment, the KH550 silane coupling agent layer 301 is distributed on both sides of the graphene oxide fluororesin sealant layer 302. The KH550 silane coupling agent layer 301 is disposed on contact surfaces of the LED chip 2 and the quartz glass 4. The above structure has a better bonding effect.

Also referring to FIG. 5, a method for manufacturing the LED package 100 in the second exemplary embodiment is presented. The method for manufacturing the LED package 100 is provided by way of example, as there are a variety of ways to carry out the method. The exemplary method can begin at step 51.

At step 51, a LED chip without quartz lenses and quartz lenses are ultrasonic cleaned.

At step 52, the 1 wt % KH550 silane coupling agent solution in the fluororesin interfacial agent of the LED package was dropped on the surface of the LED chip and the bottom of the quartz lens, and after evenly applied, the LED chip and the quartz lens are baked at 80° C. for 5 minutes to obtain the KH550 silane coupling agent layer.

At step 53, the 0.1 wt % concentration of graphene oxide fluororesin sealant in the fluororesin interfacial agent is coated on the surface of the LED chip by a dispenser to obtain the graphene oxide fluororesin sealant layer.

At step 54, the LED chip coated by the 0.05 wt % concentration of graphene oxide fluororesin sealant in the fluororesin interfacial agent (the graphene oxide fluororesin sealant layer in step 53) is processed by vacuum defoaming for 10 minutes to form the sealing layer, and the KH550 silane coupling agent layer of the quartz lens is added on the sealing layer and adjusted to the center of the LED chip to form the LED package 100 in the second exemplary embodiment.

At step 55, the LED package 100 is baked in an oven, a baking temperature was set to 80° C., and a reaction time was 12 hours, and then the LED package 100 shown in FIG. 1 was obtained.

In at least one embodiment, steps of preparing the 1 wt % KH550 silane coupling agent solution in the step 52 is as follows: first, deionized water is added to absolute ethanol, and ultrasonically oscillated to obtain 5 wt % deionized water solution, then the KH550 silane coupling agent are added to the 5 wt % deionized water solution, and ultrasonically shaken to prepare the 1 wt % KH550 silane coupling agent solution.

In at least one embodiment, steps of preparing the 0.1 wt % concentration of the graphene oxide fluororesin sealant in step 53 is as follows: first, the graphene oxide powder is ball-milled to a certain weight of graphene oxide by a ball mill, and the graphene oxide powder is added to absolute ethanol, after 1 hour of ultrasonic vibration, to obtain 2 mg/mL of graphene oxide dispersion; then the 2 mg/mL graphene oxide dispersion was added to a centrifuge tube containing the fluororesin matrix, and stirred with a glass rod for 15 minutes to obtain a mixture A of the graphene oxide dispersion with the fluororesin matrix, and then the mixture A is placed in a centrifuge, and the number of revolutions is set to 10,000 rpm, to carry out centrifugal stratification to obtain a mixture B of the graphene oxide-fluororesin with the fluororesin matrix. Then anhydrous ethanol in the mixture B was naturally dried, and the remaining liquid was further stirred for 1 hour to obtain the 0.1 wt % concentration of the graphene oxide fluororesin sealant.

Also referring to FIG. 1, in a third exemplary embodiment, the LED package 100 includes a substrate 1, a chip 2, a sealing layer 3, and a quartz glass 4 in this order. The sealing layer 3 includes a 0.2 wt % concentration of a graphene oxide fluororesin sealant layer 302 and a 1 wt % KH550 silane coupling agent layer 301. The 0.2 wt % concentration of the graphene oxide fluororesin sealant layer 302 is composed of a 2 mg/mL graphene oxide dispersion liquid and a fluororesin matrix. The 2 mg/mL graphene oxide dispersion liquid is composed of graphene oxide powder and anhydrous Ethanol composition. The 1 wt % KH550 silane coupling agent layer 301 consists of a 5 wt % deionized water solution and a KH550 silane coupling agent. The 5 wt % deionized water solution is composed of deionized water and absolute ethanol.

In at least one embodiment, the fluororesin matrix is a polymerized perfluoro-4-vinyloxy-1-butene having a —CF3 terminal, which is polymerized from inorganic molecules of a fluorine element. Thus, the fluororesin matrix has a high ultraviolet transmittance, an excellent ultraviolet radiation stability, a good water and oxygen resistance and a poor adhesion.

In at least one embodiment, the graphene oxide powder is prepared by a Hummers method. The graphene oxide powder has a typical quasi-two-dimensional structure, which has sheet layers contain many oxygen-containing groups. The graphene oxide powder has a high specific surface energy, a good hydrophilicity, a high thermal conductivity, a mechanical properties and a barrier effect. Thus, the graphene oxide powder is an ideal composite doping material.

In at least one embodiment, the KH550 silane coupling agent contains two different reactive groups, an amino group and an oxy group, for coupling an organic polymer and an inorganic filler.

FIG. 2 shows a principle of a reaction between the graphene oxide powder and the KH550 silane coupling agent. The graphene oxide powder reacts with the KH550 silane coupling agent to form molecular crosslinks, and a bonding interface and the fluororesin matrix are tightly held together like numerous molecular anchors, which improves a bonding ability of the fluororesin sealant and ensures the reliability of the LED package.

FIG. 3 is a schematic diagram of a comparison of C1s photoelectron spectra. To prove the designed anchored crosslinks between the fluoropolymer embedded by the graphene oxide powder (GO) and the KH550 silian coupling agent (APTS), the X-ray photoelectron spectroscopy (XPS) of the graphene oxide powder reacting with the KH550 silane coupling agent (m-GO) were respectively investigated, and the results are shown in FIG. 3. Compared with the GO (1 of FIG. 3), the peak intensity of C—OH (285.9 eV), C=O (286.7 eV) and C—C=O (288.5 eV) in m-GO48-49 are obviously decreased in m-GO because of the reaction between GO and APTS. The N1s, Si2s, and Si2p peaks of m-GO are observed (2 of FIG. 3), confirming the existence of the molecule APTS as the anchor chain.

FIG. 4 is a schematic diagram of a comparison of infrared spectra, 1 is the infrared spectra of the graphene oxide powder, and 2 is the infrared spectra of the graphene oxide powder reacting with the KH550 silane coupling agent. FIG. 4 shows the FTIR spectra results of GO (1) and m-GO (2), and they indicate the existence of —O—H (3433 $cm^{-1}$), —C=O (1725 $cm^{-1}$), —O—H (1624 $cm^{-1}$), —C—O (1403 $cm^{-1}$), and —C—O—C (1053 $cm^{-1}$)[50-53], illustrating that there are a large number of oxygen-containing groups grown on the surface of GO. Compared the FTIR spectra result of GO with that of m-GO, the peak of —O—H (3433 $cm^{-1}$) becomes wide and weak, and the peak of —C—OH also disappears, suggesting a chemical crosslink formed between the APTS and GO according to following reaction:

GO—COOH+$NH_2(CH_2)_2Si$(O—)$_3$

→GO—$CONH(CH_2)_2Si$(O—)$_3$+$H_2O$  (1)

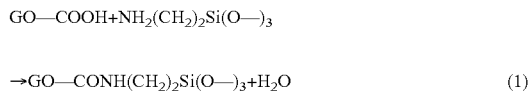

FIG. 3 and FIG. 4 actually prove that the graphene oxide powder and the KH550 silane coupling agent can react chemically. FIGS. 3 and 4 provide a factual basis for the theory of FIG. 2.

In at least one embodiment, the KH550 silane coupling agent layer 301 is distributed on both sides of the graphene oxide fluororesin sealant layer 302. The KH550 silane coupling agent layer 301 is disposed on contact surfaces of the LED chip 2 and the quartz glass 4. The above structure has a better bonding effect.

Also referring to FIG. 5, a method for manufacturing the LED package 100 in the third exemplary embodiment is presented. The method for manufacturing the LED package 100 is provided by way of example, as there are a variety of ways to carry out the method. The exemplary method can begin at step 51.

At step 51, a LED chip without quartz lenses and quartz lenses are ultrasonic cleaned.

At step 52, the 1 wt % KH550 silane coupling agent solution in the fluororesin interfacial agent of the LED package was dropped on the surface of the LED chip and the bottom of the quartz lens, and after evenly applied, the LED chip and the quartz lens are baked at 80° C. for 5 minutes to obtain the KH550 silane coupling agent layer.

At step 53, the 0.2 wt % concentration of graphene oxide fluororesin sealant in the fluororesin interfacial agent is coated on the surface of the LED chip by a dispenser to obtain the graphene oxide fluororesin sealant layer.

At step 54, the LED chip coated by the 0.05 wt % concentration of graphene oxide fluororesin sealant in the fluororesin interfacial agent (the graphene oxide fluororesin sealant layer in step 53) is processed by vacuum defoaming for 10 minutes to form the sealing layer, and the KH550 silane coupling agent layer of the quartz lens is added on the sealing layer and adjusted to the center of the LED chip to form the LED package 100 in the second exemplary embodiment.

At step 55, the LED package 100 is baked in an oven, a baking temperature was set to 80° C., and a reaction time was 12 hours, and then the LED package 100 shown in FIG. 1 was obtained.

In at least one embodiment, steps of preparing the 1 wt % KH550 silane coupling agent solution in the step 52 is as follows: first, deionized water is added to absolute ethanol, and ultrasonically oscillated to obtain 5 wt % deionized water solution, then the KH550 silane coupling agent are added to the 5 wt % deionized water solution, and ultrasonically shaken to prepare the 1 wt % KH550 silane coupling agent solution.

In at least one embodiment, steps of preparing the 0.2 wt % concentration of the graphene oxide fluororesin sealant in the step 53 is as follows: first, the graphene oxide powder is ball-milled to a certain weight of graphene oxide by a ball mill, and the graphene oxide powder is added to absolute ethanol, after 1 hour of ultrasonic vibration, to obtain 2 mg/mL of graphene oxide dispersion; then the 2 mg/mL graphene oxide dispersion was added to a centrifuge tube containing the fluororesin matrix, and stirred with a glass rod for 15 minutes to obtain a mixture A of the graphene oxide dispersion with the fluororesin matrix, and then the mixture A is placed in a centrifuge, and the number of revolutions is set to 10,000 rpm, to carry out centrifugal stratification to obtain a mixture B of the graphene oxide-fluororesin with the fluororesin matrix. Then anhydrous ethanol in the mixture B was naturally dried, and the remaining liquid was further stirred for 1 hour to obtain the 0.2 wt % concentration of the graphene oxide fluororesin sealant.

Figure 6:
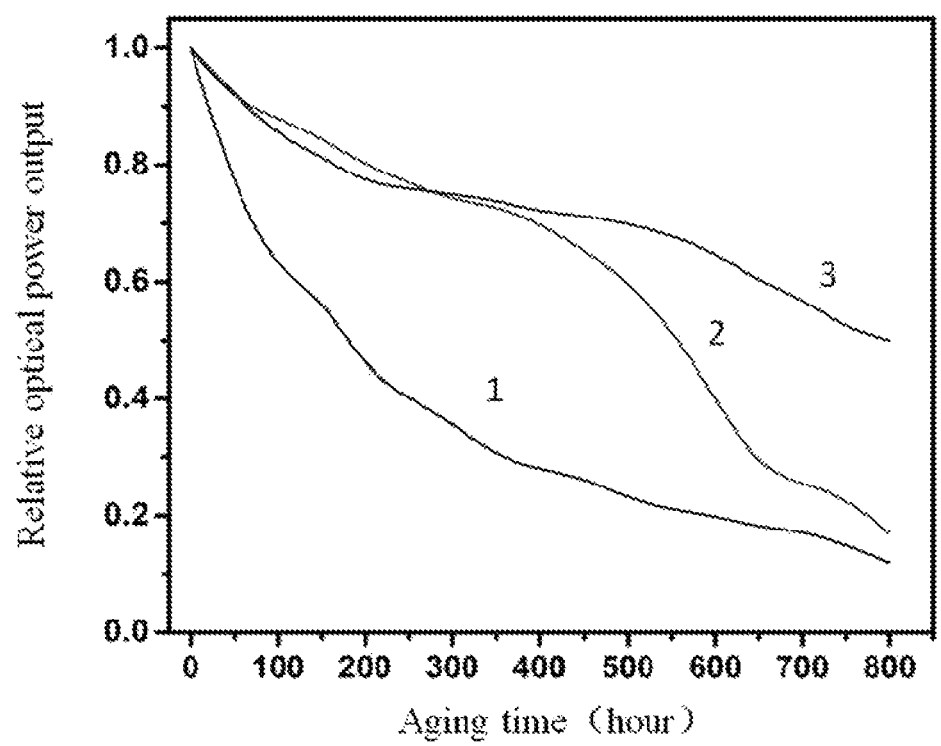
FIG. 6 is a diagram showing a result of light decay accelerated aging test of the LED package and existing LED package having fluororesin matrix.

FIG. 6 shows a result of light decay accelerated aging test of the LED package 100 and existing LED package having fluororesin matrix. In FIG. 6, curve 1 is a light decay accelerated aging test curve of the existing LED package, and curve 2 is a light decay accelerated aging test curve of an LED package 100 treated with an interface agent containing a 0.05 wt % concentration of a graphene oxide fluororesin sealant provided by the present invention, curve 3 is a light decay accelerated aging test curve of an LED package 100 treated with an interface agent containing a 0.1 wt % concentration of a graphene oxide fluororesin sealant provided by the present invention, curve 4 is a light decay accelerated aging test curve of an LED package 100 treated with an interface agent containing a 0.2 wt % concentration of a graphene oxide fluororesin sealant provided by the present invention. It can be seen that the anti-aging ability of the LED package 100 provided by the invention is obviously enhanced.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A LED package comprising:
a substrate;
a LED chip;
a sealing layer; and
a quartz glass;
wherein the substrate, the chip, the sealing layer and the quartz glass are arranged in this order, the sealing layer comprises a graphene oxide fluororesin sealant layer and two NH2CH2CH2CH2Si(OC2H5)3 (KH550) silane coupling agent layers, the graphene oxide fluororesin sealant layer is composed of a graphene oxide dispersion liquid and a fluororesin matrix, the KH550 silane coupling agent layer is composed of deionized water solution and silane coupling agent.

2. The LED package of claim 1, wherein the two KH550 silane coupling agent layers are respectively distributed on both sides of the graphene oxide fluororesin sealant layer, the two KH550 silane coupling agent layers are respectively disposed on contact surfaces of the LED chip and the quartz glass.

3. The LED package of claim 2, wherein the graphene oxide dispersion liquid is composed of graphene oxide powder and anhydrous ethanol, the deionized water solution is composed of deionized water and absolute ethanol.

4. The LED package of claim 2, wherein the fluororesin matrix is a polymerized perfluoro-4-vinyloxy-1-butene having a —CF3 terminal.

5. The LED package of claim 2, wherein the graphene oxide powder is manufactured by a hummers method, the graphene oxide powder has a typical quasi-two-dimensional structure, which has sheet layers contain many oxygen-containing groups.

6. The LED package of claim 1, wherein the graphene oxide fluororesin sealant layer is 0.05-0.20 wt % concentration of graphene oxide fluororesin sealant layer, the KH550 silane coupling agent layer is 1 wt % KH550 silane coupling agent solution.

7. The LED package of claim 1, wherein the KH550 silane coupling agent layer is composed of deionized water solution and KH550 silane coupling agent, the KH550 silane coupling agent contains two different reactive groups, an amino group and an oxy group, for coupling an organic polymer and an inorganic filler.

* * * * *